(12) United States Patent
Watano et al.

(10) Patent No.: US 11,740,506 B2
(45) Date of Patent: Aug. 29, 2023

(54) WAVELENGTH CONVERSION MEMBER, BACKLIGHT UNIT, AND LIQUID CRYSTAL DISPLAY DEVICE

(71) Applicant: FUJIFILM Corporation, Tokyo (JP)

(72) Inventors: Akiko Watano, Kanagawa (JP); Tatsuya Oba, Kanagawa (JP); Hirofumi Toyama, Kanagawa (JP); Takashi Yonemoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 428 days.

(21) Appl. No.: 16/902,590

(22) Filed: Jun. 16, 2020

(65) Prior Publication Data

US 2020/0310195 A1    Oct. 1, 2020

Related U.S. Application Data

(63) Continuation of application No. PCT/JP2018/047345, filed on Dec. 21, 2018.

(30) Foreign Application Priority Data

Dec. 21, 2017 (JP) ................ 2017-244997
Jun. 5, 2018 (JP) ................ 2018-107513

(51) Int. Cl.
*H01L 33/50* (2010.01)
*G02F 1/13357* (2006.01)
*G02F 1/1335* (2006.01)

(52) U.S. Cl.
CPC ...... *G02F 1/133603* (2013.01); *H01L 33/504* (2013.01); *C09K 2323/035* (2020.08);
(Continued)

(58) Field of Classification Search
CPC ......... G02F 1/133603; G02F 1/133602; G02F 1/133614; G02F 1/133507; G02F 1/1336; C09K 2323/035; H01L 33/504
(Continued)

(56) References Cited

U.S. PATENT DOCUMENTS

2011/0045288 A1    2/2011  Koda et al.
2015/0373858 A1    12/2015 Sasaki et al.
(Continued)

FOREIGN PATENT DOCUMENTS

JP    2002-327126 A    11/2002
JP    2005-002290 A    1/2005
(Continued)

OTHER PUBLICATIONS

International Search Report issued in PCT/JP2018/047345 dated Mar. 26, 2019.
(Continued)

*Primary Examiner* — Ruiyun Zhang
(74) *Attorney, Agent, or Firm* — Edwards Neils LLC; Jean C. Edwards, Esq.

(57) ABSTRACT

A wavelength conversion member suppresses peeling at an edge at cutting; and is used with a backlight unit and a liquid crystal display device. The wavelength conversion member includes a first substrate, a wavelength conversion layer, and a second substrate, in which each of the first and second substrates includes a support, a barrier layer, and an organic layer, where each of the barrier layers contains at least aluminum and phosphorus, each of the organic layers is formed of a composition containing a polymer A having a glass transition temperature of 50° C. or lower and a polymer B having an acryloyl or methacryloyl group in a molecule thereof, and the wavelength conversion layer is a layer in which at least one selected from the group consisting
(Continued)

of a quantum dot, a phosphor particle, and a phosphor coloring agent is dispersed in a matrix made of an acrylic resin.

17 Claims, 2 Drawing Sheets

(52) U.S. Cl.
CPC .. *G02F 1/133507* (2021.01); *G02F 1/133602* (2013.01); *G02F 1/133605* (2013.01); *G02F 1/133614* (2021.01)

(58) Field of Classification Search
USPC .............................. 428/1.33, 1.3, 1.1; 349/69
See application file for complete search history.

(56) References Cited

U.S. PATENT DOCUMENTS

| | | | |
|---|---|---|---|
| 2017/0088324 A1* | 3/2017 | Sasaki | ..................... B32B 27/06 |
| 2017/0320306 A1 | 11/2017 | Iwase | |
| 2017/0320307 A1 | 11/2017 | Iwase | |
| 2018/0138027 A1* | 5/2018 | Oku | .................. G02F 1/133617 |

FOREIGN PATENT DOCUMENTS

| | | |
|---|---|---|
| JP | 2006-116737 A | 5/2006 |
| JP | 2016-141050 A | 8/2016 |
| JP | 2016-141051 A | 8/2016 |
| WO | 2009/116230 A1 | 9/2009 |
| WO | 2014/122940 A1 | 8/2014 |

OTHER PUBLICATIONS

Written Opinion issued in PCT/JP2018/047345 dated Mar. 26, 2019.
International Preliminary Report on Patentability completed by WIPO dated Jun. 23, 2020 in connection with International Patent Application No. PCT/JP2018/047345.

* cited by examiner

WAVELENGTH CONVERSION MEMBER, BACKLIGHT UNIT, AND LIQUID CRYSTAL DISPLAY DEVICE

CROSS-REFERENCE TO RELATED APPLICATIONS

This application is a Continuation of PCT International Application No. PCT/JP2018/047345 filed on Dec. 21, 2018, which was published under PCT Article 21(2) in Japanese, and which claims priority under 35 U.S.C. § 119(a) to Japanese Patent Application No. 2017-244997 filed on Dec. 21, 2017 and Japanese Patent Application No. 2018-107513 filed on Jun. 5, 2018. The above applications is are hereby expressly incorporated by reference, in their entirety, into the present application.

BACKGROUND OF THE INVENTION

1. Field of the Invention

The present invention relates to a wavelength conversion member, a backlight unit, and a liquid crystal display device.

2. Description of the Related Art

Applications of a flat panel display such as a liquid crystal display (LCD) device as a space-saving image display device with low power consumption have been widespread year by year.

In the flat panel display market, an enhancement in color reproducibility is progressing as an improvement in LCD performance, and it has been proposed to use a wavelength conversion layer containing a quantum dot (QD) that converts a wavelength of incidence light and emits the wavelength-converted light, as a luminescent material (phosphor).

For example, JP2016-141051A discloses an aspect using a functional composite film having one or more sets of combinations of an inorganic layer and an organic layer serving as a base of the inorganic layer on a support, in which the outermost surface is an organic layer. Specifically, there is disclosed a quantum dot film in which a quantum dot layer formed by dispersing quantum dots in a binder is sandwiched with an organic layer on the outermost surface of the functional composite film inside ([claim 1] and [claim 8]).

SUMMARY OF THE INVENTION

The present inventors examined the quantum dot film disclosed in JP2016-141051A and found that the adhesiveness between the inorganic layer and the outermost organic layer may be poor depending on the type of inorganic layer, and in a case where the quantum dot film is cut, peeling may occur at a cut edge.

Therefore, an object of the present invention is to provide a wavelength conversion member with which the occurrence of peeling at an edge at the time of cutting can be suppressed; as well as a backlight unit and a liquid crystal display device, each of which using the wavelength conversion member.

As a result of intensive studies to achieve the foregoing object, the present inventors have found that the occurrence of peeling at an edge at the time of cutting can be suppressed by a configuration in which each of organic layers in contact with main surfaces (front surface and back surface) of a wavelength conversion layer is a layer formed of a composition containing a polymer A having a glass transition temperature of 50° C. or lower and a polymer B having an acryloyl group or a methacryloyl group in a molecule thereof. The present invention has been completed based on these findings.

That is, it has been found that the foregoing object can be achieved by the following configuration.

[1] A wavelength conversion member comprising:
a first substrate;
a wavelength conversion layer; and
a second substrate in this order,
in which each of the first substrate and the second substrate is a substrate having a support, a barrier layer, and an organic layer in this order,
the first substrate, the wavelength conversion layer, and the second substrate are provided such that the organic layer in the first substrate, the wavelength conversion layer, and the organic layer in the second substrate are in contact with each other in this order,
each of the barrier layers in the first substrate and the second substrate contains at least aluminum and phosphorus,
each of the organic Layers in the first substrate and the second substrate is a layer formed of a composition containing a polymer A having a glass transition temperature of 50° C. or lower and a polymer B having acryloyl group or a methacryloyl group in a molecule thereof, and
the wavelength conversion layer is a layer in which at least one selected from the group consisting of a quantum dot, a phosphor particle, and a phosphor coloring agent is dispersed in a matrix made of an acrylic resin.

[2] The wavelength conversion member according to [1], in which a mass ratio of the polymer A and the polymer B contained in the composition is in a range of 40:60 to 80:20.

[3] The wavelength conversion member according to [1] or [2], in which the composition further contains a polyfunctional monomer C having two or more acryloyl groups or methacryloyl groups in a molecule thereof.

[4] The wavelength conversion member according to [3], in which a content of the polyfunctional monomer C is 3% to 30% by mass with respect to a mass of a total solid content of the composition.

[5] The wavelength conversion member according to any one of [1] to [4], in which the polymer A has a urethane bond in a main chain thereof.

[6] The wavelength conversion member according to any one of [1] to [5], in which a double bond equivalent of the polymer B is 500 to 3000 g/mol.

[7] The wavelength conversion member according to any one of [1] to [6], in which a weight-average molecular weight of the polymer B is 50000 to 500000.

[8] The wavelength conversion member according to any one of [1] to [7], in which the acrylic resin constituting the matrix of the wavelength conversion layer is a copolymer of a monofunctional acrylic monomer having one acryloyl group or methacryloyl group in a molecule thereof with a polyfunctional acrylic monomer having two or more acryloyl groups or methacryloyl groups in a molecule thereof.

[9] The wavelength conversion member according to any one of [1] to [8], in which the composition further contains a resin particle or an inorganic particle.

[10] The wavelength conversion member according to any one of [1] to [9], in which the composition further contains a fluorine-based surfactant or a silicone-based surfactant.

[11] The wavelength conversion member according to any one of [1] to [10], in which a thickness of each of the organic layers in the first substrate and the second substrate is in the range of 0.1 to 1 μm.

[12] The wavelength conversion member according to any one of [1] to [11], in which a protective film having a thickness of 40 μm or more is bonded to a surface of each of the supports of the first substrate and the second substrate opposite to the barrier layer.

[13] A backlight unit comprising:
the wavelength conversion member according to any one of [1] to [12]; and
a light source.

[14] A liquid crystal display device comprising:
the backlight unit according to [13]; and
a liquid crystal cell.

According to the present invention, there is provided a wavelength conversion member with which the occurrence of peeling at an edge at the time of cutting can be suppressed; as well as a backlight unit and a liquid crystal display device, each of which using the wavelength conversion member.

DESCRIPTION OF THE PREFERRED EMBODIMENTS

Figure 1:
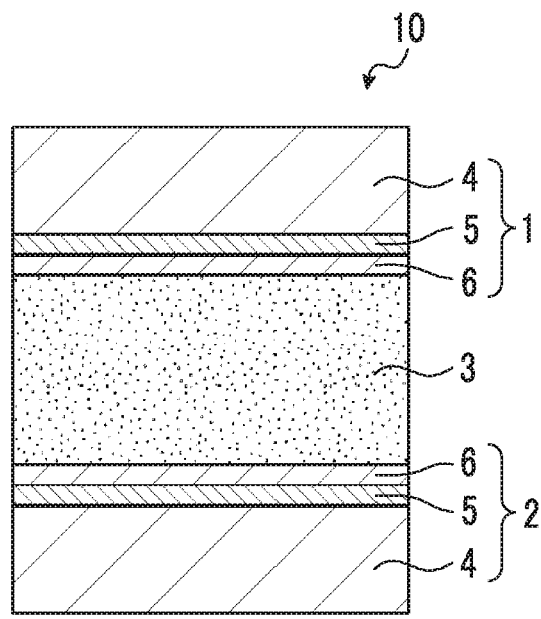
FIG. 1 is a schematic cross-sectional diagram showing an example of an embodiment of a wavelength conversion member of the present invention.

Hereinafter, the present invention will be described in detail. The description of constituent elements described below may be made based on representative embodiments of the present invention, but the present invention is not limited to such embodiments.

In addition, in the present specification, the numerical range expressed by using "to" means a range including numerical values described before and after "to" as a lower limit value and an upper limit value, respectively.

[Wavelength Conversion Member]

The wavelength conversion member according to the embodiment of the present invention is a wavelength conversion member having a first substrate, a wavelength conversion layer, and a second substrate in this order.

In addition, each of the first substrate and the second substrate is a substrate having a support, a barrier layer, and an organic layer in this order.

In addition, the first substrate, the wavelength conversion layer, and the second substrate are provided such that the organic layer in the first substrate, the wavelength conversion layer, and the organic layer in the second substrate are in contact with each other in this order.

In addition, each of the barrier layers in the first substrate and the second substrate contains at least aluminum and phosphorus.

In addition, each of the organic layers in the first substrate and the second substrate is a layer formed of a composition containing a polymer A having a glass transition temperature of 50° C. or lower and a polymer B having an acryloyl group or a methacryloyl group in a molecule thereof (hereinafter, also referred to as "composition for forming an organic layer").

In addition, the wavelength conversion layer is a layer in which at least one selected from the group consisting of a quantum dot, a phosphor particle, and a phosphor coloring agent is dispersed in a matrix made of an acrylic resin.

In the present invention, as described above, the occurrence of peeling at an edge at the time of cutting can be suppressed by a configuration in which each of the organic layers in the first substrate and the second substrate is a layer formed of a composition containing a polymer A having a glass transition temperature of 50° C. or lower and a polymer B having an acryloyl group or a methacryloyl group in a molecule thereof.

Although the reason for such an effect is not clear in detail, the present inventors speculate as follows.

That is, the present inventors speculate that, by blending the polymer A into the composition for forming an organic layer, the organic layer to be formed has improved adhesiveness to the barrier layer in the first substrate and the second substrate due to the adhesive force of the polymer A; and, by blending the polymer B into the composition for forming an organic layer, the polymer B contained in the organic layer to be formed and the acrylic resin contained in the wavelength conversion layer are chemically bonded to each other, thereby improving the adhesiveness between the organic layer and the wavelength conversion layer.

FIG. 1 is a schematic cross-sectional diagram showing an example of an embodiment of a wavelength conversion member according to the embodiment of the present invention.

A wavelength conversion member 10 shown in FIG. 1 is a wavelength conversion member having a first substrate 1, a wavelength conversion layer 3, and a second substrate 2 in this order.

In addition, as shown in FIG. 1, each of the first substrate 1 and the second substrate 2 is a substrate having a support 4, a barrier layer 5, and an organic layer 6 in this order.

Further, as shown in FIG. 1, the first substrate 1, the wavelength conversion layer 3, and the second substrate 2 are provided such that the organic layer 6 in the first substrate 1, the wavelength conversion layer 3, and the organic layer 6 in the second substrate 2 are in contact with each other in this order.

Hereinafter, each configuration of the wavelength conversion member 10 will be described in detail.

[First Substrate and Second Substrate]

Each of the first substrate and the second substrate (hereinafter, also simply referred to as "substrate" in a case where no particular distinction is required) included in the wavelength conversion member according to the embodiment of the present invention is a substrate having a support, a barrier layer, and an organic layer in this order.

<Support>

The material, thickness, and the like of the support constituting the substrate are not particularly limited as long as the support can hold a barrier layer which will be described later, but it is preferable to use a plastic film. Here, specific examples of the plastic film include films made of resin materials such as polyethylene (PE), polyethylene naphthalate (PEN), polyamide (PA), polyethylene terephthalate (PET), polyvinyl chloride (PVC), polyvinyl alcohol (PVA), polyacrylonitrile (PAN), polyimide (PI), transparent polyimide, polymethyl methacrylate resin (PMMA), polycarbonate (PC), polyacrylate, polymethacrylate, polypropylene (PP), polystyrene (PS), acrylonitrile butadiene styrene copolymer (ABS), cyclic olefin copolymer (COC), cycloolefin polymer (COP), and triacetyl cellulose (TAC).

Among these, a film made of a polyester resin such as polyethylene terephthalate (PET) is preferable.

In addition to the above-mentioned polyethylene terephthalate (PET), a polyester obtained from a polybasic acid component and a diol component, each of which will be described later, can be used as the polyester resin.

That is, examples of the polybasic acid component include terephthalic acid, isophthalic acid, phthalic acid, phthalic anhydride, 2,6-naphthalenedicarboxylic acid, 1,4-cyclohexanedicarboxylic acid, adipic acid, sebacic acid, trimellitic acid, pyromellitic acid, dimer acid, and 5-sodium sulfalsophthalic acid.

Examples of the dial component include ethylene glycol, 1,4-butanediol, diethylene glycol, dipropylene glycol, 1,6-hexanediol, 1,4-cyclohexanedimethanol, xylene glycol, dimethylolpropane, poly(ethylene oxide)glycol, and poly(tetramethylene oxide)glycol.

The thickness of the support may be appropriately set according to the application, the forming material, and the like.

In the present invention, the thickness of the support is preferably 5 to 100 μm and more preferably 10 to 50 μm, from the viewpoint that the mechanical strength of the wavelength conversion film is sufficiently secured, and it is excellent in weight reduction, thinning, flexibility, and the like.

<Barrier Layer>

The barrier layer constituting the substrate is a layer containing at least aluminum and phosphorus, and is preferably a layer having a moisture permeability of 100 g/m$^2$/24 h or less, more preferably a layer having a moisture permeability of 10 g/m$^2$/24 h or less, and still more preferably a layer having a moisture permeability of 5 g/m$^2$/24 h or less.

Here, the term "moisture permeability" refers to an amount (g/m$^2$/24 h) of water vapor that has passed for 24 hours under the conditions of a temperature of 40° C. and a relative humidity of 90%, according to the method described in JIS Z 0208: 1976 "Test method for moisture permeability of moisture-proof packaging material (cup method)".

(Aluminum)

The aluminum contained in the barrier layer is preferably contained as a compound containing aluminum (hereinafter, simply referred to as "aluminum compound").

Specific examples of the aluminum compound include aluminum chloride, aluminum nitrate, aluminum acetate, aluminum tris(2,4-pentanedionate), trimethoxy aluminum, triethoxy aluminum, tri-n-propoxy aluminum, triisopropoxy aluminum, tri-n-butoxy aluminum, tri-sec-butoxy aluminum, and tri-tert-butoxy aluminum, among which triisopropoxy aluminum and tri-sec-butoxy aluminum are preferable.

(Phosphorus)

The phosphorus contained in the barrier layer is preferably contained as a compound containing phosphorus (hereinafter, simply referred to as "phosphorus compound").

Examples of the phosphorus compound include an inorganic phosphorus compound and an organic phosphorus compound, among which an inorganic phosphorus compound is preferable.

Examples of the inorganic phosphorus compound include an oxo acid of phosphorus such as phosphoric acid, diphosphoric acid, triphosphoric acid, polyphosphoric acid in which four or more phosphoric acids are condensed, phosphorus acid, phosphonic acid, phosphonous acid, phosphinic acid, or phosphinous acid; a salt thereof (for example, sodium phosphate); and a derivative thereof (for example, a halide (for example, phosphoryl chloride), or a dehydrate (for example, diphosphorus pentoxide)).

The above-mentioned aluminum compound and phosphorus compound may be contained as a reaction product in which a part of each of them has reacted with each other.

Examples of such a reaction product include a reaction product obtained by reacting a metal oxide containing aluminum with an inorganic phosphorus compound.

The thickness of the barrier layer may be appropriately set according to the application, the forming material, and the like.

In the present invention, the thickness of the barrier layer is preferably 0.05 to 5 μm and more preferably 0.1 to 2 μm, from the viewpoint that the barrier performance is sufficiently secured, and it is excellent in weight reduction, thinning, flexibility, and the like.

<Organic Layer>

The organic layer constituting the substrate is a layer formed of a composition for forming an organic layer containing a polymer A having a glass transition temperature of 50° C. or lower and a polymer B having an acryloyl group or a methacryloyl group in a molecule thereof.

Hereinafter, the polymer A, the polymer B, and optional components contained in the composition for forming an organic layer will be described.

(Polymer A)

The polymer A is not particularly limited as long as the polymer has a glass transition temperature of 50° C. or lower.

Here, the glass transition temperature of the polymer A refers to a value measured by differential scanning calorimetry according to JIS K7121.

In addition, the glass transition temperature of the polymer A is preferably −100° C. to 50° C. and more preferably −50° C. to 30° C.

In the present invention, the polymer A preferably has a polar interaction with the barrier layer and is more preferably a polymer having a urethane bond in the main chain thereof, from the viewpoint that the adhesiveness to the barrier layer is further improved.

Here, a bond represented by —NRCOO— or —OCONR— (R represents a hydrogen atom or an alkyl group having 1 to 6 carbon atoms which may have a substituent) is preferable as the urethane bond. Examples of the substituent which the alkyl group may have include a halogen atom, a hydroxyl group, and an amino group.

Such a main chain structure can be formed by reacting a polyisocyanate component such as diisocyanate with a polyol component such as diol.

Specific examples of the polyisocyanate component capable of forming a urethane bond include tolylene diisocyanate, isophorone diisocyanate, hexamethylene diisocyanate, trimethylhexamethylene diisocyanate, norbornene diisocyanate, dicyclohexylmethane-4,4-diisocyanate, xylylene diisocyanate, diphenylmethane-4,4-diisocyanate, and dimer acid diisocyanate.

Specific examples of the polyol component capable of forming a urethane bond include ethylene glycol, polyethylene glycol, propylene glycol, polypropylene glycol, 1,4-butanediol, 2,3-butanediol, 1,3-butanediol, neopentyl glycol, methylpentanediol, 1,6-hexanediol, trimethylhexamethylenediol, 2-methyloctanediol, 1,9-nonanediol, 1,4-cyclohexanedimethanol, tricyclodecanedimethanol, polycaprolactone diol, polycarbonate diol, glycerin, trimethylolpropane, trimethyloloctane, pentaerythritol, and polytetramethylene glycol.

(Polymer B)

The polymer B is not particularly limited as long as it is a polymer having an acryloyl group or a methacryloyl group in the molecule thereof. From the viewpoint of securing a sufficient crosslink density with the acrylic resin contained in the wavelength conversion layer, the polymer B is preferably a polymer having a repeating unit represented by Formula (I).

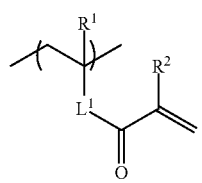

In Formula (I), $R^1$ and $R^2$ each independently represent a hydrogen atom or a methyl group.

In Formula (I), $L^1$ represents a single bond or a divalent linking group selected from the group consisting of —O—, —C(=O)—, —(C=O)O—, —(C=O)NR$^3$—, a divalent aliphatic group which may have a substituent, a divalent aromatic group which may have a substituent, and a combination thereof. $R^3$ represents a hydrogen atom or an alkyl group having 1 to 20 carbon atoms.

Hereinafter, the above-mentioned divalent linking group represented by one aspect of $L^1$ in Formula (I) will be described.

First, for —(C=O)NR$^3$— represented by one aspect of in Formula (I), $R^3$ represents a hydrogen atom or an alkyl group having 1 to 20 carbon atoms, as described above.

Here, the alkyl group having 1 to 20 carbon atoms is preferably, for example, a linear, branched, or cyclic alkyl group having 1 to 18 carbon atoms, more preferably an alkyl group having 1 to 8 carbon atoms (for example, a methyl group, an ethyl group, a propyl group, an isopropyl group, an n-butyl group, an isobutyl group, a sec-butyl group, a t-butyl group, or a cyclohexyl group), still more preferably an alkyl group having 1 to 4 carbon atoms, and particularly preferably a methyl group or an ethyl group.

In addition, for the divalent aliphatic group which may have a substituent and the divalent aromatic group which may have a substituent, each of which is represented by one aspect of $L^1$ in Formula (I), specific examples of the substituent which may be present include an alkyl group, an alkoxy group, a halogen atom, and a hydroxyl group.

Here, the alkyl group is preferably, for example, a linear, branched, or cyclic alkyl group having 1 to 18 carbon atoms, more preferably an alkyl group having 1 to 8 carbon atoms (for example, a methyl group, an ethyl group, a propyl group, an isopropyl group, an n-butyl group, an isobutyl group, a sec-butyl group, a t-butyl group, or a cyclohexyl group), still more preferably an alkyl group having 1 to 4 carbon atoms, and particularly preferably a methyl group or an ethyl group.

In addition, the alkoxy group is preferably, for example, an alkoxy group having 1 to 18 carbon atoms, more preferably an alkoxy group having 1 to 8 carbon atoms (for example, a methoxy group, an ethoxy group, an n-butoxy group, or a methoxyethoxy group), still more preferably an alkoxy group having 1 to 4 carbon atoms, and particularly preferably a methoxy group or an ethoxy group.

In addition, examples of the halogen atom include a fluorine atom, a chlorine atom, a bromine atom, and an iodine atom, among which a fluorine atom or a chlorine atom is preferable.

Examples of the divalent aliphatic group which may have a substituent include a linear, branched, or cyclic alkylene group having 1 to 10 carbon atoms which may have a substituent as described above.

Here, specific examples of the linear alkylene group include a methylene group, an ethylene group, a propylene group, a butylene group, a pentylene group, a hexylene group, and a decylene group.

In addition, specific examples of the branched alkylene group include a dimethylmethylene group, a methylethylene group, a 2,2-dimethylpropylene group, and a 2-ethyl-2-methylpropylene group.

In addition, specific examples of the cyclic alkylene group include a cyclopropylene group, a cyclobutylene group, a cyclopentylene group, a cyclohexylene group, a cyclooctylene group, a cyclodecylene group, an adamantane-diyl group, a norbornane-diyl group, and an exo-tetrahydrodicyclopentadiene-diyl group, among which a cyclohexylene group is preferable.

Examples of the divalent aromatic group which may have a substituent include an arylene group having 6 to 12 carbon atoms which may have a substituent as described above.

Here, specific examples of the arylene group having 6 to 12 carbon atoms include a phenylene group, a xylylene group, a biphenylene group, a naphthylene group, and a 2,2'-methylenebisphenyl group, among which a phenylene group is preferable.

In the present invention, $L^1$ in Formula (I) is preferably not a single bond but the divalent linking group described above, and more preferably a divalent linking group having —(C=O)O— in a portion linking to the main chain.

In the present invention, the double bond equivalent of the polymer B is preferably 500 to 3000 g/mol, more preferably 750 to 2500 g/mol, and still more preferably 1000 to 2000 g/mol, from the viewpoint of adjusting the internal stress due to the excess or deficiency of the crosslinking density and from the viewpoint that the adhesiveness to the wavelength conversion layer is further improved.

Here, the double bond equivalent of the polymer B represents the mass of the polymer B per 1 mol of an acryloyl group or a methacryloyl group.

In the present invention, the weight-average molecular weight of the polymer B is preferably 50,000 to 500,000, more preferably 100,000 to 450,000, and still more preferably 200,000 to 400,000, from the viewpoint that the blocking resistance is improved in a case of being wound up into a roll at the time of forming an organic layer.

Here, the weight-average molecular weight of the polymer B is defined as a value in terms of polystyrene measured by gel permeation chromatography (GPC). The weight-average molecular weight of the polymer A can be calculated as a value in terms of polystyrene by the measurement, for example, using EcoSEC HLC-8320GPC (manufactured by Tosoh Corporation) as a GPC apparatus, three TSKgel Super AWM-H (manufactured by Tosoh Corporation) as columns, and N-methylpyrrolidone (NMP) as an eluent, under the measurement conditions of a flow rate of 0.50 ml/min and a temperature of 40° C.

In the present invention, the mass ratio between the polymer A and the polymer B contained in the composition for forming an organic layer is preferably in the range of 40:60 to 80:20 and more preferably in the range of 50:50 to 70:30, from the viewpoint that the adhesiveness between the organic layer and the barrier layer and the adhesiveness between the organic layer and the wavelength conversion layer are further improved, and the occurrence of peeling at the edge at the time of cutting can be further suppressed.

(Polyfunctional Monomer C)

The composition for forming an organic layer preferably contains a polyfunctional monomer C having two or more acryloyl groups or methacryloyl groups in the molecule thereof, from the viewpoint that the cohesive failure of the organic layer is suppressed by increasing the cohesive force of the organic layer, and the occurrence of peeling at the edge at the time of cutting can be further suppressed.

Specific examples of the polyfunctional monomer C include alkylene glycol di(meth)acrylate having 1 to 20 carbon atoms in the alkylene chain, such as 1,4-butanediol di(meth)acrylate, 1,6-hexanediol di(meth)acrylate, or 1,9-nonanediol di(meth)acrylate; polyalkylene glycol di(meth) acrylate having 1 to 20 carbon atoms in the alkylene chain, such as polyethylene glycol di(meth)acrylate or polypropylene glycol di(meth)acrylate; tri(meth)acrylate having a total number of carbon atoms of 10 to 60, such as trimethylolpropane tri(meth)acrylate or ethylene oxide-added trimethylolpropane tri(meth)acrylate; tetra(meth)acrylate having a total number of carbon atoms of 10 to 100, such as ethylene oxide-added pentaerythritol tetra(meth)acrylate, ditrimethylolpropane tetra(meth)acrylate, or pentaerythritol tetra(meth)acrylate; and dipentaerythritol hexa(meth)acrylate. Note that the "(meth)acrylate" is a notation representing acrylate or methacrylate.

In a case where the polyfunctional monomer C is contained, the content thereof is preferably 3% to 30% by mass and more preferably 5% to 20% by mass with respect to the mass of the total solid content of the composition for forming an organic layer, from the viewpoint that the cohesive force of the organic layer is secured and the adhesiveness to the wavelength conversion layer and the barrier layer is further improved.

(Particle)

The composition for forming an organic layer preferably contains a resin particle or an inorganic particle and more preferably contains a resin particle, from the viewpoint that the blocking resistance is improved in a case of being wound up into a roll at the time of forming an organic layer.

Specific examples of the resin particle include resin particles such as acrylic resin, polyethylene, polypropylene, polyethylene oxide, polypropylene oxide, polyethylene imine, polystyrene, polyurethane, polyurea, polyester, polyamide, polyimide, carboxymethylcellulose, gelatin, starch, chitin, and chitosan, and among which resin particles such as acrylic resin, polyethylene, polypropylene, and polystyrene are suitable.

A commercially available product can also be used as the resin particle.

Specific examples of the commercially available resin particle include CHEMIPEARL W100, W200, W300, W308, W310, W400, W401, W4005, W410, W500, WF640, W700, W800, W900, W950, and WP100 (all manufactured by Mitsui Chemicals, Inc.); MX-150, MX-180, MX-300, MX-500, MX-1000, MX-1500H, MX-2000, MR-2HG, MR-7HG, MR-10HG, MR-3GSN, MR-5GSN, MR-2G, MR-7G, MR-10G, MR-20G, MR-5C, MR-7GC, SX-130H, SX-350H, SX-500H, SGP-50C, and SGP-70C (all manufactured by Soken Chemical & Engineering Co., Ltd.); and MBX-5, MBX-8, MBX-12, MBX-15, MBX-20, MB20X-5, MB30X-5, MB30X-8, MB30X-20, SRX-6, SBX-8, SBX-12, and SBX-17 (all manufactured by Sekisui Plastics Co., Ltd.).

In a case where the particle (particularly, resin particle) is contained, the content thereof is preferably 0.05% to 5% by mass and more preferably 0.1% to 2% by mass with respect to the mass of the total solid content of the composition for forming an organic layer, from the viewpoint that sufficient blocking resistance is secured and good adhesiveness to the wavelength conversion layer and the barrier layer is maintained.

(Surfactant)

The composition for forming an organic layer preferably contains a fluorine-based surfactant or a silicone-based surfactant and more preferably contains a fluorine-based surfactant, from the viewpoint that the blocking resistance is improved in a case of being wound up into a roll immediately after forming an organic layer.

The fluorine-based surfactant is preferably a compound having a fluoroalkyl group.

Here, the fluoroalkyl group preferably has 1 to 20 carbon atoms and more preferably 1 to 10 carbon atoms and may have a linear structure (for example, $-CF_2CF_3$, $-CH_2(CF_2)_4H$, $-CH_2(CF_2)_8CF_3$, or $-CH_2CH_2(CF_2)_4H$), a branched structure (for example, $CH(CF_3)_2$, $CH_2CF(CF_3)_2$, $CH(CH_3)CF_2CF_3$, or $CH(CH_3)(CF_2)_5CF_2H$), or an alicyclic structure (preferably a 5- or 6-membered ring, for example, a perfluorocyclohexyl group, a perfluorocyclopentyl group, or an alkyl group substituted therewith). In addition, the fluoroalkyl group may have an ether bond (for example, $CH_2OCH_2CF_2CF_3$, $CH_2CH_2OCH_2C_4F_8H$, $CH_2CH_2OCH_2CH_2C_8F_{17}$, or $CH_2CH_2OCF_2CF_2OCF_2CF_2H$). A plurality of fluoroalkyl groups may be contained in the same molecule.

The fluorine-based surfactant may further contain one or a plurality of substituents such as an acryloyl group, a methacryloyl group, a vinyl group, an aryl group, a cinnamoyl group, an epoxy group, an oxetanyl group, a hydroxyl group, a polyoxyalkylene group, a carboxyl group, and an amino group.

In addition, the fluorine-based surfactant may be a polymer or oligomer with a compound containing no fluorine atom, and there is no particular limitation on the molecular weight thereof.

The content of fluorine atoms in the fluorine-based surfactant is not particularly limited, but is preferably 20% by mass or more, more preferably 30% to 70% by mass, and still more preferably 40% to 70% by mass.

A commercially available product can also be used as the fluorine-based surfactant.

Examples of the commercially available fluorine-based surfactant include R-2020, M-2020, R-3833, and M-3833 (all manufactured by Daikin Chemical Industries, Ltd.); and MEGAFACE F-784, F-171, F-172, F-179A, F-114, F-251, F-281, F-410, F-430, F-444, F-477, F-510, F-511, F-552, F-553, F-554, F-555, F-556, F-557, F-558, F-559, F-560, F-561, F-562, F-563, F-567, F-569, F-570, F-571, R-40, R-41, R-43, R-94, RS-72-K, RS-76-E, RS-76-NS, RS-90, and DEFENSOR MCF-300 (all manufactured by DIC Corporation).

In a case where the surfactant is contained, the content thereof is preferably 0.05% to 5% by mass and more preferably 0.1% to 2% by mass with respect to the mass of the total solid content of the composition for forming an organic layer, from the viewpoint that sufficient blocking resistance is secured and good adhesiveness to the wavelength conversion layer and the barrier layer is maintained.

(Polymerization Initiator)

The composition for forming an organic layer preferably contains a polymerization initiator.

The polymerization initiator used is preferably a photopolymerization initiator capable of initiating a polymerization reaction by ultraviolet irradiation.

Examples of the photopolymerization initiator include α-carbonyl compounds (as described in U.S. Pat. Nos. 2,367,661A and 2,367,670A), acyloin ethers (as described in U.S. Pat. No. 2,448,828A), α-hydrocarbon-substituted aromatic acyloin compounds (as described in U.S. Pat. No. 2,722,512A), polynuclear quinone compounds (as described in U.S. Pat. Nos. 3,046,127A and 2,951,758A), combinations of triarylimidazole dimers with p-aminophenyl ketones described in U.S. Pat. No. 3,549,367A), acridine and phenazine compounds (as described in JP1985-105667A (JP-S60-105667A), and U.S. Pat. No. 4,239,850A), oxadiazole compounds (as described in U.S. Pat. No. 4,212,970A), and acylphosphine oxide compounds (as described in JP1988-040799B (JP-S63-040799B), JP1993-029234B (JP-H05-029234B), JP1998-095788A (JP-H10-095788A), and JP1998-029997A (JPH10-029997A)).

(Solvent)

The composition for forming an organic layer preferably contains a solvent from the viewpoint of workability for forming the organic layer, and the like.

Specific examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated hydrocarbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethyl formamide and dimethyl acetamide). These solvent compounds may be used alone or in combination of two or more thereof.

(Method for Forming Organic Layer)

In the present invention, examples of the method for forming an organic layer include a method in which a composition for forming an organic layer is applied onto the above-mentioned barrier layer and fixed by polymerization.

Examples of the method for applying the composition for forming an organic layer include a wire bar coating method, an extrusion coating method, a direct gravure coating method, a reverse gravure coating method, and a die-coating method.

In addition, the polymerization conditions are not particularly limited, but it is preferable to use ultraviolet rays in the polymerization by light irradiation. The irradiation amount is preferably 10 mJ/cm$^2$ to 50 J/cm$^2$, more preferably 20 mJ/cm$^2$ to 5 J/cm$^2$, still more preferably 30 mJ/cm$^2$ to 3 J/cm$^2$, and particularly preferably 50 to 1000 mJ/cm$^2$. In addition, in order to accelerate the polymerization reaction, the reaction may be carried out under heating conditions.

In the present invention, the thickness of the organic layer constituting the substrate is preferably 0.1 to 1 μm and more preferably 0.3 to 0.8 μm, from the viewpoint that the adhesiveness to the barrier layer and the wavelength conversion layer is further improved and therefore the deterioration of the edge of the wavelength conversion member is suppressed.

[Wavelength Conversion Layer]

The wavelength conversion layer of the wavelength conversion member according to the embodiment of the present invention is a layer in which at least one selected from the group consisting of a quantum dot, a phosphor particle, and a phosphor coloring agent is dispersed in a matrix made of an acrylic resin. Here, the acrylic resin refers to a polymer of an acrylic ester or a methacrylic ester.

<Matrix>

An acrylic resin or a copolymerization component described in paragraphs [0033] to [0063] of JP2010-079175A can be appropriately used as the acrylic resin constituting the matrix of the wavelength conversion layer.

In the present invention, from the viewpoint of securing the barrier performance of the matrix, the acrylic resin constituting the matrix of the wavelength conversion layer is preferably a copolymer of a monofunctional acrylic monomer having one acryloyl group or methacryloyl group in the molecule thereof with a polyfunctional acrylic monomer having two or more acryloyl groups or methacryloyl groups in the molecule thereof.

The monofunctional acrylic monomer refers to a monomer having one acryloyl group or methacryloyl group in the molecule thereof. For example, it is preferable to use an alkyl (meth)acrylate having 4 to 30 carbon atoms and having a long-chain alkyl group having 4 to 30 carbon atoms, and it is more preferable to use an alkyl (meth)acrylate having 12 to 22 carbon atoms from the viewpoint of improving the dispersibility of the quantum dot which will be described later.

Specific examples of the monofunctional acrylic monomer include butyl (meth)acrylate, octyl (meth)acrylate, lauryl (meth)acrylate, oleyl (meth)acrylate, stearyl (meth)acrylate, behenyl (meth)acrylate, butyl (meth)acrylamide, octyl (meth)acrylamide, lauryl (meth)acrylamide, oleyl (meth)acrylamide, stearyl (meth)acrylamide, and behenyl (meth)acrylamide, among which lauryl (meth)acrylate, oleyl (meth)acrylate, or stearyl (meth)acrylate is particularly preferable.

On the other hand, examples of the polyfunctional acrylic monomer include those similar to the polyfunctional monomer C described above as the optional component of the composition for forming an organic layer described above.

The content of the matrix in the wavelength conversion layer is not particularly limited and may be appropriately set according to the type of the acrylic monomer, the thickness of the wavelength conversion layer, and the like.

The content of the matrix is preferably 90% to 99.9% by mass and more preferably 92% to 99% by mass with respect to the total mass of the wavelength conversion layer.

<Quantum Dot>

The quantum dot dispersed in the matrix is not particularly limited, and a variety of known quantum dots may be appropriately selected according to the required wavelength conversion performance and the like.

Examples of the quantum dot include those described in paragraphs [0060] to [0066] of JP2012-169271A.

In addition, a commercially available product can be used without any limitation as the quantum dot. The luminescence wavelength of the quantum dot can usually be adjusted by the composition and size of the particle.

In addition, the quantum dots may be used alone or in combination of two or more thereof. In a case where two or more types of quantum dots are used in combination, two or more types of quantum dots having different wavelengths of emitted light may be used.

<Phosphor Particle>

The phosphor particle used is not particularly limited, and a variety of known phosphor particles may be appropriately selected according to the required wavelength conversion performance and the like. Examples of the phosphor particle include YAG, α-SiAlON, βSiAlON, CASN, SCASN, and KSF phosphors which are used for wavelength conversion of LED chips.

The thickness of the wavelength conversion layer may be appropriately set according to the application, the forming material, and the like.

In the present invention, the thickness of the wavelength conversion layer is preferably 10 to 200 μm and more preferably 30 to 150 μm, from the viewpoint that the brightness in a case where the wavelength conversion member is applied to a liquid crystal display device is sufficiently secured, and it is excellent in weight reduction, thinning, flexibility, and the like.

As shown in FIG. 1, the wavelength conversion member according to the embodiment of the present invention is provided with the substrates (first substrate and second substrate) and the wavelength conversion layer described above such that the organic layer in the first substrate, the wavelength conversion layer, and the organic layer in the second substrate are in contact with each other in this order.

In addition, in the wavelength conversion member according to the embodiment of the present invention, from the viewpoint of securing the strength of the barrier layer at the time of producing the wavelength conversion member and securing the strength at the time of use as the wavelength conversion member, a protective film having a thickness of 40 μm or more may be bonded through an adhesive or the like to the surface of the support of the substrate opposite to the barrier layer.

Examples of the protective film include a glass substrate and a polymer film.

The protective film bonded at the time of producing the wavelength conversion member may be peeled off after the production thereof.

Examples of the material of the polymer film include a cellulose-based polymer such as triacetyl cellulose (TAC), diacetyl cellulose, or cellulose acetate propionate; an acrylic polymer such as polymethacrylate or polyacrylate; a polycarbonate-based polymer; a polyester-based polymer such as polyethylene terephthalate or polyethylene naphthalate; a styrene-based polymer such as polystyrene or acrylonitrile-styrene copolymer (AS resin); polyolefin-based polymer such as polyethylene, polypropylene, or ethylene-propylene copolymer; a polymer having an alicyclic structure such as norbornene-based polymer, polymer of monocyclic cyclic olefins, polymer of cyclic conjugated dimes, or vinyl alicyclic hydrocarbon polymer; a vinyl chloride-based polymer; an amide-based polymer such as nylon or aromatic polyamide; an imide-based polymer; a sulfone-based polymer; a polyether sulfone-based polymer; a polyether ether ketone-based polymer; a polyphenylene sulfide-based polymer; a vinylidene chloride-based polymer; a vinyl alcohol-based polymer; a vinyl butyral-based polymer; an acrylate-based polymer; a polyoxymethylene-based polymer; an epoxy-based polymer; and a polymer obtained by mixing these polymers.

In addition, the wavelength conversion member according to the embodiment of the present invention may be bonded to another backlight optical sheet from the viewpoint of securing the film strength. Such bonding increases the film strength of the entire member, which leads to the use of a thin substrate of 40 μm or less as the substrate of the wavelength conversion member, or the reduction of the substrate of another backlight optical sheet, thus resulting in a reduced total thickness of the backlight, whereby a liquid crystal display device having excellent installation properties can be provided.

In one aspect, the wavelength conversion member according to the embodiment of the present invention may be bonded to a member having a concave-convex structure having periodicity on one main surface. From the viewpoint of brightness enhancement and light collection, it is preferable to partially bond the wavelength conversion member according to the embodiment of the present invention to the other main surface of the member having a concave-convex structure having periodicity on one main surface.

The member having a concave-convex structure having periodicity on one main surface may be, for example, a prism sheet. The prism sheet may be a member having a stripe structure in which concavity and convexity are arranged in one direction, or may be a composite member in which a plurality of layers of stripe structures in different directions are stacked. A member in which two prism structures and a dielectric multilayer film are further laminated integrally is also preferable.

Partial bonding refers to a state in which only a part of the surface is bonded and the other parts thereof are not bonded. One example thereof includes, hut is not limited to, applying a pressure sensitive adhesive to only a part of the surface. The area percentage occupied by the bonding portion to the main surface is preferably 0.1% or more and less than 10%, more preferably 0.5% or more and less than 5%, and still more preferably 0.5% or more and less than 2%.

In a case where the area percentage is low, the bonding is not sufficient and the film strength cannot be sufficiently secured; and in a ease where the area percentage is high, the light collection function of the concave-convex structure is lost and therefore the brightness of the backlight decreases.

For bonding, a known bonding agent such as an adhesive or a pressure sensitive adhesive can be used. The refractive index of the bonding agent is preferably 1.45 or less, more preferably 1.42 or less, and still more preferably 1.38 or less. Due to a low refractive index, the light collection function can be maintained even in a case of bonding.

[Backlight Unit]

A backlight unit according to the embodiment of the present invention is a backlight unit including the above-mentioned wavelength conversion member according to the embodiment of the present invention and a light source.

The backlight unit according to the embodiment of the present invention will be described with reference to the drawings.

Figure 2:
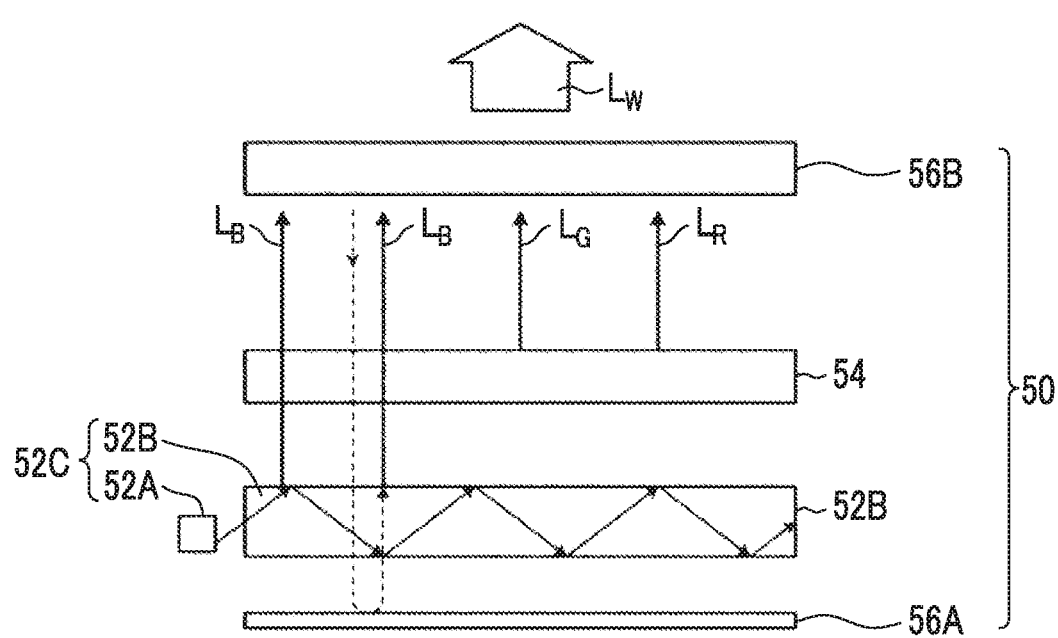
FIG. 2 is a diagram conceptually illustrating an example of an embodiment of a backlight unit of the present invention.

FIG. 2 is a schematic diagram showing a schematic configuration of the backlight unit.

As shown in FIG. 2, a backlight unit 50 comprises a planar light source 52C including a light source 52A that emits primary light (blue light $L_B$) and a light guide plate 52B that guides and emits the primary light emitted from the light source 52A, a wavelength conversion member 54 according to the embodiment of the present invention provided on the planar light source 52C, a reflecting plate 56A arranged opposite to the wavelength conversion member 54 with the planar light source 52C interposed therebetween, and a retroreflective member 56B. In FIG. 2, the reflecting plate 56A, the light guide plate 52B, the wavelength conversion member 54, and the retroreflective member 56B are spaced apart from one another, but in reality these members may be formed in intimate attachment with one another.

The wavelength conversion member 54 emits fluorescence by using at least a part of primary light $L_B$ emitted from the planar light source 52C as excitation light and emits secondary light (green light $L_G$ and red light $L_R$) composed of the fluorescence and primary light $L_B$ transmitted through the wavelength conversion member 54. For example, the wavelength conversion member 54 is a phosphor-containing film 10 which is constituted such that a phosphor-containing layer 16 including the quantum dots that emit the green light $L_G$ and the quantum dots that emit the red light $L_R$ upon irradiation with the blue light $L_B$ is sandwiched between a first substrate film 12 and a second substrate film 14.

In FIG. 2, $L_B$, $L_G$, and $L_R$ emitted from the wavelength conversion member 54 are incident on the retroreflective member 56B, and each incident light repeats reflection between the retroreflective member 56B and the reflecting plate 56A and passes through the wavelength conversion member 54 many times. As a result, in the wavelength conversion member 54, a sufficient amount of excitation light (blue light $L_B$) is absorbed by phosphors 24 (in this case, quantum dots) in the phosphor-containing layer 16 and a necessary amount of fluorescence ($L_G$ and $L_R$) is emitted, and white light $L_W$ is embodied from the retroreflective member 56B and is emitted.

From the viewpoint of realizing high brightness and high color reproducibility, it is preferable to use a backlight unit having a multi-wavelength light source, as the backlight unit 50. For example, preferred is a backlight unit which emits blue light having a luminescence center wavelength in the wavelength range of 430 to 480 nm and having a luminescence intensity peak with a half-width of 100 nm or less, green light having a luminescence center wavelength in the wavelength range of 500 to 600 nm and having a luminescence intensity peak with a half-width of 100 nm or less, and red light having a luminescence center wavelength in the wavelength range of 600 to 680 nm and having a luminescence intensity peak with a half-width of 100 nm or less.

From the viewpoint of further improving brightness and color reproducibility, the wavelength range of the blue light emitted from the backlight unit 50 is more preferably 440 to 460 nm.

From the same viewpoint, the wavelength range of the green light emitted from the backlight unit 50 is preferably 520 to 560 nm and more preferably 520 to 545 nm.

In addition, from the same viewpoint, the wavelength range of the red light emitted from the backlight unit 50 is more preferably 610 to 640 nm.

In addition, from the same viewpoint, all the half-widths of the respective luminescence intensities of the blue light, the green light, and the red light emitted from the backlight unit 50 are preferably 80 nm or less, more preferably 50 nm or less, still more preferably 40 nm or less, and particularly preferably 30 nm or less. Among them, the half width of the luminescence intensity of the blue light is particularly preferably 25 nm or less.

The light source 52A is, for example, a blue light emitting diode that emits blue light having a luminescence center wavelength in the wavelength range of 430 to 480 nm, but an ultraviolet light emitting diode that emits ultraviolet light may be used. As the light source 52A, a laser light source or the like may be used in addition to light emitting diodes. In a case where a light source that emits ultraviolet light is provided, the phosphor-containing layer 16 (wavelength conversion layer) of the wavelength conversion member 54 may include a phosphor that emits blue light, a phosphor that emits green light, and a phosphor that emits red light, upon irradiation with ultraviolet light.

As shown in FIG. 2, the planar light source 52C may be a planar light source including the light source 52A and the light guide plate 52B that guides and emits the primary light emitted from the light source 52A, or may be a planar light source in which the light source 52A and the wavelength conversion member 54 are arranged parallel to each other on the plane, and a diffusion plate is provided in place of the light guide plate 52B. The former planar light source is generally referred to as an edge light mode, and the latter planar light source is generally referred to as a direct backlight mode.

In the present embodiment, a case where a planar light source is used as a light source has been described as an example, but a light source other than the planar light source may also be used as the light source.

(Configuration of Backlight Unit)

In FIG. 2, an edge light mode backlight unit including a light guide plate, a reflecting plate, and the like as constituent members has been illustrated as the configuration of the backlight unit, but the backlight unit may be a direct backlight mode backlight unit. A known light guide plate can be used without any limitation as the light guide plate.

In addition, the reflecting plate 56A is not particularly limited, and known reflecting plates can be used, which are described in JP3416302B, JP3363565B, JP4091978B, JP3448626B, and the like, the contents of which are incorporated by reference herein in their entirety.

The retroreflective member 56B may be configured of a known diffusion plate, diffusion sheet, prism sheet (for example, BEF series manufactured by Sumitomo 3M Limited), light guide device, or the like. The configuration of the retroreflective member 56B is described in JP3416302B, JP3363565B, JP4091978B, JP3448626B, and the like, the contents of which are incorporated by reference herein in their entirety.

[Liquid Crystal Display Device]

A liquid crystal display device according to the embodiment of the present invention is a liquid crystal display device including the above-mentioned backlight unit according to the embodiment of the present invention and a liquid crystal cell.

The liquid crystal display device according to the embodiment of the present invention will be described with reference to the drawings.

Figure 3:
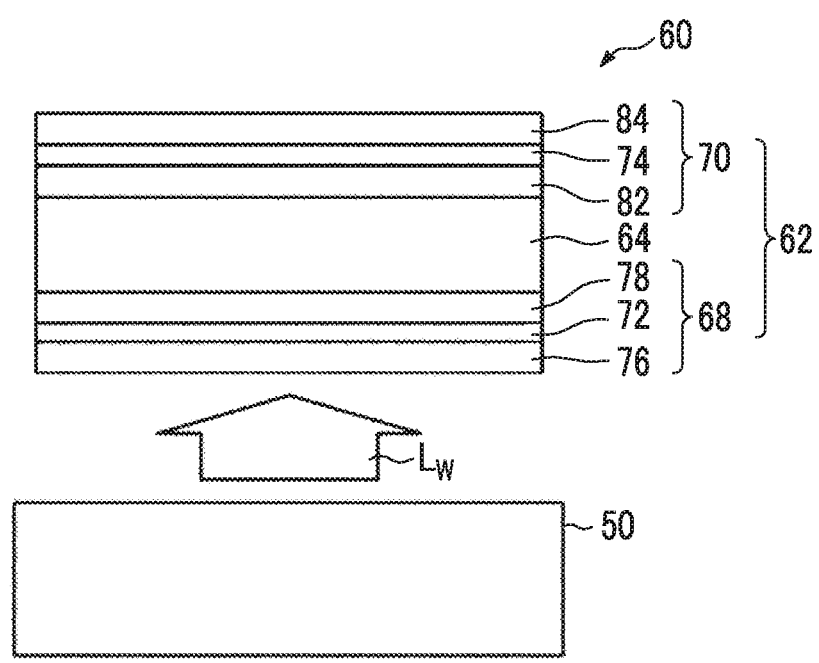
FIG. 3 is a diagram conceptually illustrating an example of an embodiment of a liquid crystal display device of the present invention.

FIG. 3 is a schematic diagram showing a schematic configuration of a liquid crystal display device.

As shown in FIG. 3, a liquid crystal display device 60 comprises the backlight unit 50 of the above-mentioned embodiment, and a liquid crystal cell unit 62 arranged opposite to the retroreflective member side of the backlight unit.

As shown in FIG. 3, the liquid crystal cell unit 62 has a configuration in which a liquid crystal cell 64 is sandwiched between polarizing plates 68 and 70, and the polarizing plates 68 and 70 are configured such that both main surfaces of polarizers 72 and 74 are protected by polarizing plate protective films 76 and 78, and 82 and 84, respectively.

The liquid crystal cell 64 and the polarizing plates 68 and 70 constituting the liquid crystal display device 60 and the constituents thereof are not particularly limited, and products produced by a known method and commercially available products can be used without any limitation. In addition, it is also possible, of course, to provide a known interlayer such as an adhesive layer between the respective layers.

A driving mode of the liquid crystal cell 64 is not particularly limited, and various modes such as a twisted nematic (TN) mode, a super twisted nematic (STN) mode, a vertical alignment (VA) mode, an in-plane switching (IPS) mode, and an optically compensated bend cell (OCB) mode can be used. The driving mode of the liquid crystal cell is preferably a VA mode, an OCB mode, an IPS mode, or a TN mode, but is not limited thereto. An example of the configuration of the liquid crystal display device in the VA mode may be the configuration illustrated in FIG. 2 of JP2008-262161A. Here, a specific configuration of the liquid crystal display device is not particularly limited, and a known configuration can be adopted.

Further, the liquid crystal display device 60 includes a subsidiary functional layer such as an optical compensation member performing optical compensation or an adhesive layer, if necessary. In addition, a surface layer such as a forward scattering layer, a primer layer, an antistatic layer, or an undercoat layer may be arranged together with (or in place of) a color filter substrate, a thin layer transistor substrate, a lens film, a diffusion sheet, a hard coat layer, an antireflection layer, a low reflective layer, an antiglare layer, or the like.

The polarizing plate 68 on the backlight unit 50 side may include a phase difference film as the polarizing plate protective film 78 on the liquid crystal cell 64 side. A known cellulose acylate film or the like can be used as such a phase difference film.

The backlight unit according to the embodiment of the present invention can be applied not only to a liquid crystal display device but also to an organic electroluminescence (EL) display device and a display device using a micro LED (Light Emitting Diode) as a light source.

EXAMPLES

Hereinafter, features of the present invention will be described more specifically with reference to Examples and Comparative Examples. The materials, use amounts, proportions, treatment contents, treatment procedures, and the like shown in the following Examples can be appropriately modified without departing from the spirit of the present invention. Therefore, the scope of the present invention should not be construed as being limited by the specific examples described below.

Example 1

[Support with Barrier Layer]
KURARISTER CI [support: PET film (thickness: 12 μm), barrier layer (thickness: 0.5 μm)] manufactured by Kuraray Co., Ltd. was used as the support with a barrier layer.

The barrier layer of KURARISTER CI was confirmed to contain aluminum and phosphorus by X-ray fluorescence analysis (XRF) using Primus II manufactured by Rigaku Corporation.

[Bonding of Protective Film]
PANAPROTECT CT50 (thickness: 50 μm, manufactured by Panac Co., Ltd.) was bonded as a protective film to the support-side surface of the support with a barrier layer.

[Formation of Organic Layer]
An organic layer was formed on the barrier layer-side surface of the support with a barrier layer according to the following procedure.

First, 120 parts by mass of a hydroxyl group-terminated urethane resin (TAKELAC A-520, glass transition temperature: —17° C., manufactured by Mitsui Chemicals, Inc.) as polymer A, 105 parts by mass of a urethane acrylic polymer (ACRIT 8BR-500, double bond equivalent: 1700 g/mol, weight-average molecular weight: 200000, manufactured by Taisei Fine Chemical Co., Ltd.) as polymer B, and 1.0 parts by mass of a photopolymerization initiator (IRGACURE TPO, manufactured by BASF SE) were weighed and dissolved in methyl ethyl ketone to prepare a coating liquid (composition for forming an organic layer) having a solid content concentration of 7%. TAKELAC A-520 and ACRIT 8BR-500 were both products containing a solvent together with a polymer, and had a solid content concentration of 50% and 37%, respectively. Therefore, the glass transition temperature of TAKELAC A-520 was measured after previously heating in a constant temperature zone at 120° C. for 30 minutes to volatilize the solvent.

Then, this coating liquid was directly applied onto the surface of the barrier layer by a roll-to-roll process using a die coater, and passed through a drying zone at 100° C. for 3 minutes.

Thereafter, while being held on a heat roll heated to 60° C., the applied coating liquid was irradiated with ultraviolet rays (integrated irradiation amount: about 300 mJ/cm$^2$) to be cured, and the resulting structure was wound up to produce a substrate on which an organic layer, a barrier layer, and a support were laminated in this order. The thickness of the organic layer formed on the support was 0.6 μm.

[Production of Wavelength Conversion Layer]
The following quantum dot dispersion liquid 1 was prepared, filtered through a polypropylene filter having a pore size of 0.2 μm, and dried under reduced pressure for 30 minutes to use as a coating liquid.

| Quantum dot dispersion liquid 1 | |
| --- | --- |
| Toluene dispersion liquid of quantum dot 1 (emission maximum: 530 nm) | 10 parts by mass |
| Toluene dispersion liquid of quantum dot 2 (emission maximum: 620 nm) | 1 part by mass |
| Lauryl methacrylate | 2.4 parts by mass |
| Trimethylolpropane triacrylate | 0.54 parts by mass |
| Photopolymerization initiator (IRGACURE 819, manufactured by BASF SE) | 0.009 parts by mass |
| Silane coupling agent C | 0.09 parts by mass |

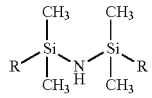

Silane coupling agent C (In the above, R represents $CH_2CHCOOCH_2$. The silane coupling agent C was synthesized with reference to the method described in JP2009-067778A.)

The following nanocrystals having a core-shell structure (InP/ZnS) were used as quantum dots 1 and 2.
Quantum dot 1: INP 530-10 (manufactured by NN-Labs, LLC): fluorescence half-width: 65 nm
Quantum dot 2: INP 620-10 (manufactured by NN-Labs, LLC): fluorescence half-width: 70 nm The substrate produced above was used as a first substrate, and the quantum dot dispersion liquid 1 was applied onto the surface of the organic layer of the first substrate.

Next, the applied dispersion liquid was cured by irradiating ultraviolet rays using an air-cooled metal halide lamp (manufactured by Eye Graphics Co., Ltd.) of 160 W/cm$^2$ while purging with nitrogen to form a wavelength conversion layer 1 having a thickness of 280 μm.

Next, the substrate produced above was used as a second substrate, and the organic layer of the second substrate and the wavelength conversion layer 1 were adhered by a lamination process.

Thereafter, the protective films bonded to the first substrate and the second substrate were peeled off to produce a wavelength conversion member.

Examples 2 to 4

A wavelength conversion member was produced in the same manner as in Example 1, except that the composition of the coating liquid (composition for forming an organic layer) was changed to the composition shown in Table 1 below.

In Table 1 below, MX-150 and RS-90 represent the additives shown below, respectively.

MX-150: resin particle (manufactured by Soken Chemical & Engineering Co., Ltd.)

RS-90: fluorine-based surfactant (manufactured by DIC Corporation)

Example 5

A wavelength conversion member was produced in the same manner as in Example 3, except that a 50-μm-thick PET film (COSMOSHINE A4300, manufactured by Toyobo Co., Ltd.) was bonded in place of PANAPROTECT CT50 (thickness: 50 μm, manufactured by Panac Co., Ltd.) as the protective film, and the protective films bonded to the first substrate and the second substrate were not peeled off.

Comparative Example 1

A wavelength conversion member was produced in the same manner as in Example 1, except that the organic layer was not formed.

Comparative Example 2

A wavelength conversion member was produced in the same manner as in Example 1, except that a two-component reactive polyurethane-based adhesive described in paragraph [0201] of WO2016/103720A was used as the coating liquid (composition for forming an organic layer).

Comparative Example 3

A wavelength conversion member was produced in the same manner as in Example 1, except that the surface organic layer 18 described in paragraph [0112] of JP2016-141051A was used as the organic layer.

In Table 1 below, ACRIT 8UH-1006 is a urethane polymer having a methacryloyl group in a side chain thereof (double bond equivalent: 366 g/mol, weight-average molecular weight: 20,000, manufactured by Taisei Fine Chemical Co., Ltd.).

Example 6

A wavelength conversion member was produced in the same manner as in Example 1, except that the composition of the coating liquid (composition for forming an organic layer) was changed to the composition shown in Table 1 below, and the following phosphor dispersion liquid 1 was used in place of the quantum dot dispersion liquid.

[Production of Wavelength Conversion Layer]

| Phosphor dispersion liquid 1 | |
|---|---|
| Green phosphor 1 (emission maximum: 539 nm) | 20 parts by mass |
| Toluene dispersion liquid of quantum dot 2 (emission maximum: 620 nm) | 1 part by mass |
| Lauryl methacrylate | 2.4 parts by mass |
| Trimethylolpropane triacrylate | 0.54 parts by mass |
| Photopolymerization initiator (IRGACURE 819, manufactured by BASF SE) | 0.009 parts by mass |
| Silane coupling agent C | 0.09 parts by mass |

The following phosphor was used as the green phosphor 1.

β-SiAlON: GR-SW532D (manufactured by Denka Company Limited): phosphor half-width: 53 nm Example 7

A wavelength conversion member was produced in the same manner as in Example 1, except that the composition of the coating liquid (composition for forming an organic layer) was changed to the composition shown in Table 1 below, and the following phosphor dispersion liquid 2 was used in place of the quantum dot dispersion liquid.

[Production of Wavelength Conversion Layer]

| Phosphor dispersion liquid 2 | |
|---|---|
| Green phosphor 1 (emission maximum: 539 nm) | 10 parts by mass |
| Red phosphor 1 (emission maximum: 633 nm) | 20 parts by mass |
| Lauryl methacrylate | 2.4 parts by mass |
| Trimethylolpropane triacrylate | 0.54 parts by mass |
| Photopolymerization initiator (IRGACURE 819, manufactured by BASF SE) | 0.009 parts by mass |
| Silane coupling agent C | 0.09 parts by mass |

The following phosphor was used as the red phosphor 1.

KSF: KR-M212097-2 (manufactured by Denka Company Limited): phosphor half-width: 9 nm Example 8

The composition of the coating liquid (composition for forming an organic layer) was changed to the composition shown in Table 1 below, and an organic layer was formed by the method described in Example 1. Next, the following phosphor dispersion liquid 3 was filled into a mold having a lattice shape with a depth of 100 μm, a groove width of 100 μm, and a pitch of 500 μm, and the support with a barrier layer was nipped with a rubber roll to remove excess phosphor dispersion liquid. This was followed by curing by irradiating ultraviolet rays using a 160 W/cm² air-cooled metal halide lamp (manufactured by Eye Graphics Co., Ltd.), and peeling from the mold to obtain a support with a concave-convex phosphor layer. Then, the following phosphor dispersion liquid 4 was filled in the support with a concave-convex phosphor layer under a nitrogen purge, followed by lamination with the support with a barrier layer, and then curing by irradiating ultraviolet rays to produce a wavelength conversion member.

| Phosphor dispersion liquid 3 | |
| --- | --- |
| Green phosphor 1 (emission maximum: 539 nm) | 10 parts by mass |
| Lauryl methacrylate | 2.4 parts by mass |
| Trimethylolpropane triacrylate | 0.54 parts by mass |
| Photopolymerization initiator (IRGACURE 819, manufactured by BASF SE) | 0.009 parts by mass |
| Silane coupling agent C | 0.09 parts by mass |

| Phosphor dispersion liquid 4 | |
| --- | --- |
| Toluene dispersion liquid of quantum dot 2 (emission maximum: 620 nm) | 1 part by mass |
| Lauryl methacrylate | 2.4 parts by mass |
| Trimethylolpropane triacrylate | 0.54 parts by mass |
| Photopolymerization initiator (IRGACURE 819, manufactured by BASF SE) | 0.009 parts by mass |
| Silane coupling agent C | 0.09 parts by mass |

[Evaluation of Cuttability]

For each of the produced wavelength conversion members, the wavelength conversion member was punched into a 3.5 cm square using a Thomson blade, and the state of the film edge was observed with an optical microscope and evaluated from the following viewpoints. The results are shown in Table 2 below.

A: There is no peeling at the edge.
B: Peeling at the edge is less than 0.5 mm.
C: Peeling at the edge is 0.5 to 1 mm.
D: Peeling at the edge is 1 to 5 mm.
E: Peeling at the edge is 5 mm or more or there is complete peeling at the edge.

[Evaluation of Blocking Resistance]

A support with a barrier layer on which a protective film was bonded and an organic layer was formed (hereinafter, referred to as "film") was cut into two sheets of 3.5 cm square, two sheets were stacked such that the protective film and the organic layer of each film were in contact with each other, and the films were left for 1 day in an environment of 30° C. and 80% relative humidity with a pressure of 0.5 MPa applied in a direction perpendicular to the surface. Thereafter, the samples were taken out and the two samples were peeled off, and the state of each film was evaluated from the following viewpoints. The results are shown in Table 2 below.

For Comparative Example 1 in which no organic layer was formed, the evaluation was carried out using the support with a barrier layer to which the protective film was bonded.

In addition, in Comparative Example 3, since the adhesiveness between the organic layer and the barrier layer was low and the evaluation could not be carried out, it is described as "-" in Table 2 below.

A: Two films are peeled off slippery without applying force, and no adhesion marks or the like are observed.
B: Two films are peeled off without applying force, and no adhesion marks or the like are observed.
C: In a case where two films are peeled off, a slight load is felt, but no adhesion marks or the like are observed.
D: In a case where two films are peeled off, a strong load is felt and minute adhesion marks are generated.
E: In a case where two films are peeled off, a strong load is felt, and adhesion marks and peeling of the film are generated.

TABLE 1

| | Support with barrier layer | | | | Organic layer | |
| --- | --- | --- | --- | --- | --- | --- |
| | Support | | Barrier layer | | | |
| | | Thickness | | Thickness | Composition for forming organic layer | |
| | Type | (um) | Type | (um) | Polymer A | Polymer B |
| Example 1 | PET | 12 | Aluminum and phosphorus contained | 0.5 | TAKELAC A-520 60 wt % | ACRIT 8BR-500 40 wt % |
| Example 2 | PET | 12 | Aluminum and phosphorus contained | 0.5 | TAKELAC A-520 57 wt % | ACRIT 8BR-500 35 wt % |
| Example 3 | PET | 12 | Aluminum and phosphorus contained | 0.5 | TAKELAC A-520 57 wt % | ACRIT 8BR-500 34 wt % |
| Example 4 | PET | 12 | Aluminum and phosphorus contained | 0.5 | TAKELAC A-520 57 wt % | ACRIT 8BR-500 34 wt % |
| Example 5 | PET | 12 | Aluminum and phosphorus contained | 0.5 | TAKELAC A-520 57 wt % | ACRIT 8BR-500 34 wt % |
| Comparative Example 1 | PET | 12 | Aluminum and phosphorus contained | 0.5 | — | — |
| Comparative Example 2 | PET | 12 | Aluminum and phosphorus contained | 0.5 | TAKELAC A-1102 94 wt % | — |
| Comparative Example 3 | PET | 12 | Aluminum and phosphorus contained | 0.5 | — | ACRIT 8UH-1006 34 wt % |
| Example 6 | PET | 12 | Aluminum and phosphorus contained | 0.5 | TAKELAC A-520 57 wt % | ACRIT 8BR-500 34 wt % |

TABLE 1-continued

| | | | | | | |
|---|---|---|---|---|---|---|
| Example 7 | PET | 12 | Aluminum and phosphorus contained | 0.5 | TAKELAC A-520 57 wt % | ACRIT 8BR-500 34 wt % |
| Example 8 | PET | 12 | Aluminum and phosphorus contained | 0.5 | TAKELAC A-520 57 wt % | ACRIT 8BR-500 34 wt % |

| | Organic layer | | | | | |
|---|---|---|---|---|---|---|
| | Composition for forming organic layer | | | | | Thickness (μm) |
| | Polyfunctional monomer C | Photopolymerization initiator | Resin particle | Fluorine-based surfactant | Other | |
| Example 1 | — | Irg. TPO 1 wt % | — | — | — | 0.6 |
| Example 2 | DPHA 7 wt % | Irg. TPO 1 wt % | — | — | — | 0.6 |
| Example 3 | DPHA 7 wt % | Irg. TPO 1 wt % | MX-150 1 wt % | — | — | 0.6 |
| Example 4 | DPHA 7 wt % | Irg. TPO 1 wt % | MX-150 1 wt % | RS-90 0.5 wt % | — | 0.6 |
| Example 5 | DPHA 7 wt % | Irg. TPO 1 wt % | MX-150 1 wt % | — | — | 0.6 |
| Comparative Example 1 | — | — | — | — | — | 0.6 |
| Comparative Example 2 | — | — | — | — | TAKELAC A-3070 6 wt % | 0.6 |
| Comparative Example 3 | — | Irg. TPO 1 wt % | — | — | Urethane polyester phosphate compound Silane coupling agent | 0.6 |
| Example 6 | DPHA 7 wt % | Irg. TPO 1 wt % | MX-150 1 wt % | — | — | 0.6 |
| Example 7 | DPHA 7 wt % | Irg. TPO 1 wt % | MX-150 1 wt % | — | — | 0.6 |
| Example 8 | DPHA 7 wt % | Irg. TPO 1 wt % | MX-150 1 wt % | — | — | 0.6 |

TABLE 2

| | Wavelength conversion layer | | | | Evaluation | |
|---|---|---|---|---|---|---|
| | Matrix | Phosphor | Thickness (μm) | Protective film | Cuttability | Blocking resistance |
| Example 1 | Lauryl methacrylate Trimethylolpropane triacrylate | INP-530-10 INP-620-10 | 80 | Peeling | B | C |
| Example 2 | Lauryl methacrylate Trimethylolpropane triacrylate | INP-530-10 INP-620-10 | 80 | Peeling | A | B |
| Example 3 | Lauryl methacrylate Trimethylolpropane triacrylate | INP-530-10 INP-620-10 | 80 | Peeling | A | A |
| Example 4 | Lauryl methacrylate Trimethylolpropane triacrylate | INP-530-10 INP-620-10 | 80 | Peeling | A | A |
| Example 5 | Lauryl methacrylate Trimethylolpropane triacrylate | INP-530-10 INP-620-10 | 80 | PET 50 μm | A | A |
| Comparative Example 1 | Lauryl methacrylate Trimethylolpropane triacrylate | INP-530-10 INP-620-10 | 80 | Peeling | E | B |
| Comparative Example 2 | Lauryl methacrylate Trimethylolpropane triacrylate | INP-530-10 INP-620-10 | 80 | Peeling | C | E |
| Comparative Example 3 | Lauryl methacrylate Trimethylolpropane triacrylate | INP-530-10 INP-620-10 | 80 | Peeling | D | — |

TABLE 2-continued

| | Wavelength conversion layer | | | | Evaluation | |
|---|---|---|---|---|---|---|
| | Matrix | Phosphor | Thickness (μm) | Protective film | Cuttability | Blocking resistance |
| Example 6 | Lauryl methacrylate Trimethylolpropane triacrylate | β-SiAlON INP-620-10 | 80 | Peeling | A | A |
| Example 7 | Lauryl methacrylate Trimethylolpropane triacrylate | β-SiAlON KFS | 80 | Peeling | A | A |
| Example 8 | Lauryl methacrylate Trimethylolpropane triacrylate | β-SiAlON INP-620-10 | 100 | Peeling | A | A |

From the results shown in Table 1 and Table 2, it was found that the occurrence of peeling at an edge at the time of cutting can be suppressed in a case where the organic layer is formed using a composition containing both the polymer A having a glass transition temperature of 50° C. or lower and the polymer B having an acryloyl group or a methacryloyl group in a molecule thereof (Examples 1 to 8).

In addition, from the comparison between Example 1 and Example 2, it was found that the occurrence of peeling at the edge at the time of cutting can be further suppressed in a case where the organic layer is formed using a composition in which the polyfunctional monomer C is blended.

In addition, from the comparison of Examples 2 to 4, it was found that the occurrence of peeling at the edge at the time of cutting can be still further suppressed in a case where the organic layer is formed using a composition in which the resin particles and the fluorine-based surfactant are blended.

EXPLANATION OF REFERENCES

1: first substrate
2: second substrate
3: wavelength conversion layer
4: support
5: barrier layer
6: organic layer
10: wavelength conversion member
50: backlight unit
52A: light source
52B: light guide plate
52C: planar light source
54: wavelength conversion member
56A: reflecting plate
56B: retroreflective member
60: liquid crystal display device
62: liquid crystal cell unit
64: liquid crystal cell
68, 70: polarizing plate
72, 74: polarizer
76, 78, 82, 84: polarizing plate protective film

What is claimed is:

1. A wavelength conversion member comprising:
a first substrate;
a wavelength conversion layer; and
a second substrate in this order,
wherein each of the first substrate and the second substrate is a substrate having a support, a barrier layer, and an organic layer in this order,
the first substrate, the wavelength conversion layer, and the second substrate are provided such that the organic layer in the first substrate, the wavelength conversion layer, and the organic layer in the second substrate are in contact with each other in this order,
each of the barrier layers in the first substrate and the second substrate contains at least aluminum and phosphorus,
each of the organic layers in the first substrate and the second substrate is a layer formed of a composition containing a polymer A having a glass transition temperature of 50° C. or lower and a polymer B having an acryloyl group or a methacryloyl group in a molecule thereof,
the wavelength conversion layer is a layer in which at least one selected from the group consisting of a quantum dot, a phosphor particle, and a phosphor coloring agent is dispersed in a matrix made of an acrylic resin,
a weight-average molecular weight of the polymer B is 50000 to 500000, and
wherein a double bond equivalent of the polymer B is 500 to 3000 g/mol.

2. The wavelength conversion member according to claim 1,
wherein a mass ratio of the polymer A and the polymer B contained in the composition is in a range of 40:60 to 80:20.

3. The wavelength conversion member according to claim 1,
wherein the composition further contains a polyfunctional monomer C having two or more acryloyl groups or methacryloyl groups in a molecule thereof.

4. The wavelength conversion member according to claim 3,
wherein a content of the polyfunctional monomer C is 3% to 30% by mass with respect to a mass of a total solid content of the composition.

5. The wavelength conversion member according to claim 1,
wherein the polymer A has a urethane bond in a main chain thereof.

6. The wavelength conversion member according to claim 1,
wherein the acrylic resin constituting the matrix of the wavelength conversion layer is a copolymer of a monofunctional acrylic monomer having one acryloyl group or methacryloyl group in a molecule thereof with a polyfunctional acrylic monomer having two or more acryloyl groups or methacryloyl groups in a molecule thereof.

7. The wavelength conversion member according to claim 1,
wherein the composition further contains a resin particle or an inorganic particle.

8. The wavelength conversion member according to claim 1,
wherein the composition further contains a fluorine-based surfactant or a silicone-based surfactant.

9. The wavelength conversion member according to claim 1,
wherein a thickness of each of the organic layers in the first substrate and the second substrate is in the range of 0.1 to 1 μm.

10. The wavelength conversion member according to claim 1,
wherein a protective film having a thickness of 40 μm or more is bonded to a surface of each of the supports of the first substrate and the second substrate opposite to the barrier layer.

11. A backlight unit comprising:
the wavelength conversion member according to claim 1; and
a light source.

12. A liquid crystal display device comprising:
the backlight unit according to claim 11; and
a liquid crystal cell.

13. The wavelength conversion member according to claim 2,
wherein the composition further contains a polyfunctional monomer C having two or more acryloyl groups or methacryloyl groups in a molecule thereof.

14. The wavelength conversion member according to claim 13,
wherein a content of the polyfunctional monomer C is 3% to 30% by mass with respect to a mass of a total solid content of the composition.

15. The wavelength conversion member according to claim 2,
wherein the polymer A has a urethane bond in a main chain thereof.

16. A backlight unit comprising:
the wavelength conversion member according to claim 2; and
a light source.

17. A liquid crystal display device comprising:
the backlight unit according to claim 16; and
a liquid crystal cell.

* * * * *